United States Patent
Lin et al.

(10) Patent No.: US 6,906,568 B2
(45) Date of Patent: *Jun. 14, 2005

(54) HYSTERESIS COMPARING DEVICE WITH CONSTANT HYSTERESIS WIDTH AND THE METHOD THEREOF

(75) Inventors: Jyh-fong Lin, Shindian (TW); Cheng-Kuo Yang, Shindian (TW)

(73) Assignee: Via Technologies, Inc., Taipei (TW)

( * ) Notice: Subject to any disclaimer, the term of this patent is extended or adjusted under 35 U.S.C. 154(b) by 0 days.

This patent is subject to a terminal disclaimer.

(21) Appl. No.: 10/610,642

(22) Filed: Jul. 2, 2003

(65) Prior Publication Data

US 2004/0095177 A1 May 20, 2004

Related U.S. Application Data

(63) Continuation-in-part of application No. 10/082,214, filed on Feb. 26, 2002, now Pat. No. 6,597,224.

(30) Foreign Application Priority Data

Mar. 30, 2001 (TW) .......................................... 90107637 A

(51) Int. Cl.[7] .............................................. H03K 3/037
(52) U.S. Cl. ......................... 327/205; 327/539; 327/76; 327/77
(58) Field of Search ................................ 327/205, 206, 327/74, 76, 77, 538, 539, 540, 541, 543, 407, 408; 323/313, 315, 316

(56) References Cited

U.S. PATENT DOCUMENTS

| | | | |
|---|---|---|---|
| 4,581,545 A | * | 4/1986 | Beale et al. ................ 327/206 |
| 5,155,386 A | * | 10/1992 | Abdi ............................ 327/67 |
| 5,336,942 A | * | 8/1994 | Khayat ....................... 327/206 |
| 5,923,211 A | * | 7/1999 | Maley et al. ................ 327/540 |
| 6,172,555 B1 | * | 1/2001 | Gusinov ...................... 327/539 |
| 6,377,108 B1 | * | 4/2002 | Kennedy et al. ............ 327/407 |
| 6,597,224 B2 | * | 7/2003 | Lin et al. .................... 327/205 |

FOREIGN PATENT DOCUMENTS

JP          403055912 A     *  3/1991

* cited by examiner

*Primary Examiner*—Long Nguyen
(74) *Attorney, Agent, or Firm*—Rabin & Berdo, PC

(57) ABSTRACT

A hysteresis comparing device with constant hysteresis width and the method thereof, which can respectively receive a first signal and a second signal and can output a digital signal. The hysteresis comparing device includes a threshold voltage generator, a multiplexer, and a next stage comparator. The threshold voltage generator is used to receive the first signal and output an upper threshold voltage and a lower threshold voltage. The multiplexer is used to receive the upper threshold voltage and the lower threshold voltage, and output a multiplexing signal according to the digital signal. The multiplexing signal is either the upper threshold voltage or the lower threshold voltage. The next stage comparator has one terminal used to receive the multiplexing signal, and another terminal used to receive the second signal. The next stage comparator outputs the digital signal. The hysteresis comparing device with constant hysteresis width can suppress the effect from the glitch. Also and, under the affection of the environment, a constant hysteresis width can still provided, so that the hysteresis, comparing device can judge the received signals with higher precision.

19 Claims, 6 Drawing Sheets

HYSTERESIS COMPARING DEVICE WITH CONSTANT HYSTERESIS WIDTH AND THE METHOD THEREOF

This application incorporates by reference of Taiwan application Serial No. 90107637, filed Mar. 3, 2001.

This application is a continuation-in-part application Ser. No. 10/082,214, which was filed on Feb. 26, 2002 now U.S. Pat. No. 6,597,224.

BACKGROUND OF THE INVENTION

1. Field of the Invention

This invention is related to a hysteresis comparing device, and more particularly, related to a hysteresis comparing device with constant hysteresis width.

2. Description of Related Art

Referring to FIG. 1, it is a block diagram, schematically illustrating a conventional tracking servo control loop. The tracking servo control loop is used in a CD/DVD system for reading information data stored in the CD/DVD disc and outputting the digital signals. The tracking servo control loop 100 includes a pick-up head (PUH) 102, a tracking-error signal generator 104, a low pass filter 106, and a hysteresis comparing device 108. The pick-up head 102 is used to access information signals from the CD/DVD disc, and output two satellite signals Ve and Vf. These two signals have a phase different of 180°. The tracking error signal generator 104 is coupled to the pick-up head 102 for receiving the satellite signals of Ve and Vf and then generate a tracking signal Va. The low pass filter 106 is coupled to the tracking error signal generator 104 to receive the tracking signal Va, and then generate a low pass signal Vdc in a direct current type. The low pass signal Vdc is an averaged signal level of the tracking signal Va. The hysteresis comparing device 108 has a positive input terminal, which is coupled to the tracking error signal generator 104 to receive the tracking signal Va. A negative input terminal of the hysteresis comparing device 108 is coupled to the low pass filter 106 to receive the low pass signal Vdc. The hysteresis comparing device 108 is used to receive the tracking signal Va and the low pass signal Vdc, and output the digital signal Vd.

Referring to FIG. 2, it is a drawing, schematically illustrating a signal transformation diagram for the hysteresis comparing device 108. In FIG. 2, the horizontal axis represents the tracking signal Va, which is received by the hysteresis comparing device 108 at the positive input terminal. The vertical axis represents digital signal Vd, which is outputed by the hysteresis comparing device 108. When the digital signal Vd is at the low voltage level and the voltage value of the tracking signal Va is gradually increasing up to an upper threshold voltage Vth, the digital signal Vd outputted by the hysteresis comparing device 108 is transformed form a low voltage level to the high voltage level. When the digital signal Vd is at the high voltage level and the voltage value of the tracking signal Va is gradually decreasing down to a lower threshold voltage Vtl, the digital signal Vd outputted by the hysteresis comparing device 108 then is transformed form a high voltage level to the low voltage level. The voltage difference between the upper threshold voltage Vth and the lower threshold voltage Vtl is called as hysteresis width. The hysteresis width usually is, for example, 20 mV. In general, when the voltage difference for a usual comparator from the positive input terminal to the negative input terminal is greater than zero, a voltage with high level is outputted. When the voltage difference for a usual comparator from the positive input terminal to the negative input terminal is less than zero, a voltage with low level is outputted. However, when the voltage difference for the hysteresis comparing device 108 from the positive input terminal to the negative input terminal is at the increasing stage, that is, the voltage difference is gradually increasing, as shown in FIG. 2 with indication of the route A. The output of the hysteresis comparing device 108 is then transformed into the high voltage level only when the voltage at the positive terminal is necessary to be greater than the upper threshold voltage Vth. When the voltage difference for the hysteresis comparing device 108 from the positive input terminal to the negative input terminal is at the decreasing stage, as shown in FIG. 2 with indication of the route D, the output of the hysteresis comparing device 108 is then transformed into the low voltage level only when the voltage at the positive terminal is necessary to be less than the lower threshold voltage Vtl. The hysteresis comparing device 108 is used to prevent glitch at the input terminal from occurring, and prevent a misjudgment on the signal.

Referring to FIG. 3, it is drawing, schematically illustrating a signal waveform for the tracking servo control loop 100. The tracking error signal generator 104 further outputs the tracking signal Va according to the satellite signals Ve and Vf. The tracking signal Va has glitch induced by the interference from the high frequency signal. Due to the hysteresis effect of the hysteresis comparing device, the glitch of the voltage value between the high threshold voltage Vth and the lower voltage threshold Vtl does not affect the outputted result from the hysteresis comparing device, so that the precision for judging the signal can be improved. When the digital signal Vd is at the low voltage level, the tracking signal Va is necessary to be greater than the upper threshold voltage Vth and when the condition is satisfied, the digital signal then is transformed from the low voltage level to a high voltage level. When the digital signal Vd is at the high voltage level, the tracking signal Va is necessary to be less than the lower threshold voltage Vtl and when the condition is satisfied, the digital signal then is transformed from the high voltage level to a low voltage level.

Referring to FIG. 4, it is a circuit diagram, schematically illustrating a circuit structure of the conventional hysteresis comparing device 108. The hysteresis comparing device 108 includes PMOS transistors PC1, PC2, PD1, PD2, NMOS transistors NL, NR, and a current source Ia with a constant direct current. All of the PMOS transistors PC1, PC2, PD1, and PD2 have the source regions that are commonly coupled to the system voltage source $V_{DD}$. The gate electrode and the drain region of the transistor PD1 are electrically coupled together. The gate electrode and the drain region of the transistor PD2 are electrically coupled together. The gate electrode of the PC1 transistor is coupled to the drain region of the PC2 transistor. The gate electrode of the PC2 transistor is coupled to the drain region of the PC1 transistor. The drain region of the transistor NL is coupled to the drain region of the PC1 transistor. The drain region of the transistor NR is coupled to the drain region of the PC2 transistor, and also coupled to the constant current source Ia in cascade manner. The gate electrode of the transistor NR is the negative input terminal, and the gate electrode of the transistor NL is the positive input terminal. The hysteresis comparing device 108 has two loops. One loop is composed of the transistors PC1 and PC2 to serve as a positive feedback loop. The other one loop is composed of the transistors NL and NR to serve as a negative feedback loop. If the effect of the positive feedback loop is stronger than the effect of the negative feedback loop, then this circuit has the effect of hysteresis. This phenomenon is well known by the skill artisans. However, due to the mobility carried in the transistor, both the threshold voltage and the thickness of the gate oxide layer are easily affected or changed by the fabrication process or the operation temperature. If the transistors PC1 and PD2 are not properly matched, the transistors PC2 and PD1 are not properly matched, or the transistors NL and NR are not properly matched. Then an unstable voltage difference would be caused between the upper threshold voltage Vth and the lower threshold voltage Vtl. As a result, the width of the hysteresis comparing device 108 is not a constant.

SUMMARY OF THE INVENTION

It is therefore an objective of the present invention to provide a hysteresis comparing device with constant hysteresis width.

In accordance with the foregoing objective and other objectives of the present invention, the present invention provides a hysteresis comparing device with constant hysteresis width, which can respectively receive a first signal and a second signal and can output a digital signal. The hysteresis comparing device includes a threshold voltage generator, a multiplexer, and a next stage comparator. The threshold voltage generator is used to receive the first signal and output an upper threshold voltage and a lower threshold voltage. The multiplexer coupled to the threshold voltage generator, are used to receive the upper threshold voltage and the lower threshold voltage, and output a multiplexing signal according to the digital signal. The multiplexing signal is the upper threshold voltage or the lower threshold voltage. The next stage comparator has one terminal used to receive the multiplexing signal, and another terminal used to receive the second signal, also and the other one terminal used to output the digital signal.

The threshold voltage generator includes a bandgap reference voltage generator, a transconductance amplifier, a transistor, a reference resistor, a first current mirror, a second current mirror, a first resistor, and a second resistor. The bandgap reference voltage generator is used to produce the bandgap reference voltage. The transconductance amplifier is coupled to the bandgap reference voltage generator, in which the positive input terminal is used to receive the bandgap reference voltage. The gate electrode of the transistor is coupled to an output terminal of the transconductance amplifier, the source region of the transistor is coupled to the negative input terminal of the transconductance amplifier. One terminal of the reference resistor is coupled to the source region of the transistor, and the other terminal is coupled to a ground voltage. The current flowing through the reference resistor is a reference current. The quantity of the reference current is the result of the bandgap reference voltage divided by the reference resistor. The first current mirror has a first terminal coupled to the drain region of the transistor and used to receive the reference current, a second terminal to produce a first mirror current according to the reference current, and a third terminal to produce a second mirror current according to the reference current. A first terminal of the second current mirror, coupled to a second terminal of the first current mirror, are used to receive the first mirror current; and the second terminal of the second current mirror is to produce a second mirror current according to the first mirror current. One terminal of the first resistor is coupled to the third terminal of the first current mirror, and a voltage on this terminal is the upper threshold voltage. The other terminal of the first resistor is to receive the first signal. One terminal of the second resistor is coupled the other terminal of the first resistor. The other terminal of the second resistor is coupled to the second terminal of the second current mirror. The voltage of the other second terminal of the second current mirror. The voltage of the other terminal of the second resistor is the lower threshold voltage.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

Figure 1:
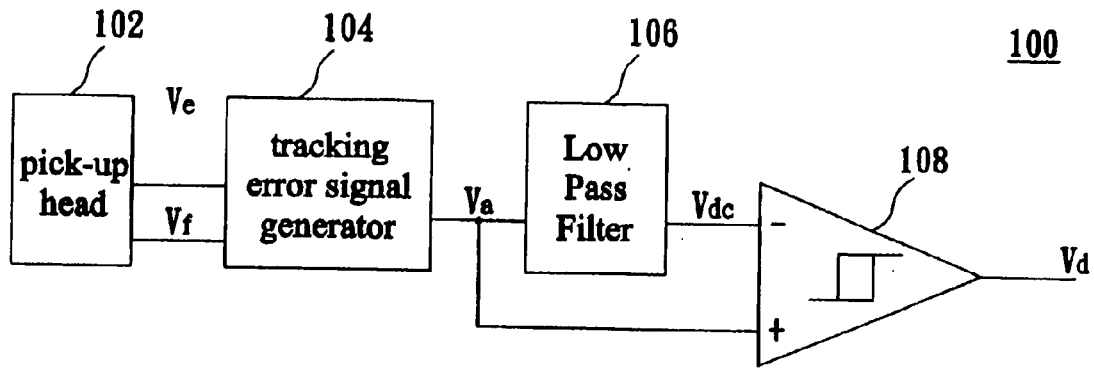
FIG. 1 is a block diagram, schematically illustrating a conventional tracking servo control loop.
Figure 2:
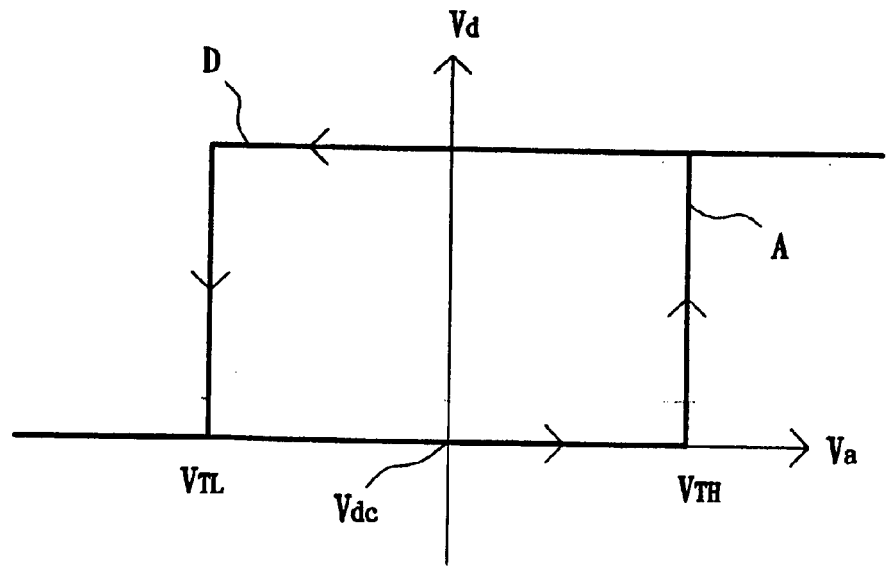
FIG. 2 is a drawing, schematically illustrating a signal transformation diagram for the hysteresis comparing device 108.
Figure 3:
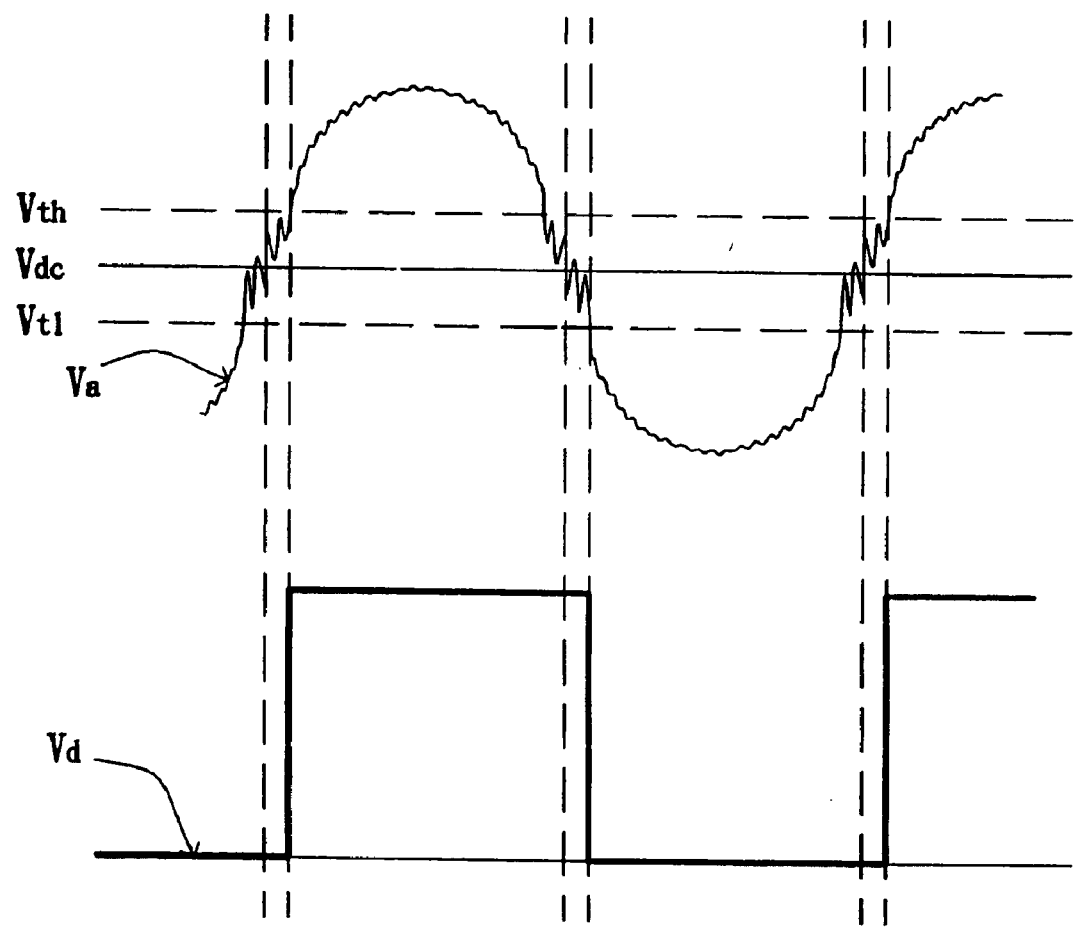
FIG. 3 is drawing, schematically illustrating a signal waveform for the tracking servo control loop.
Figure 4:
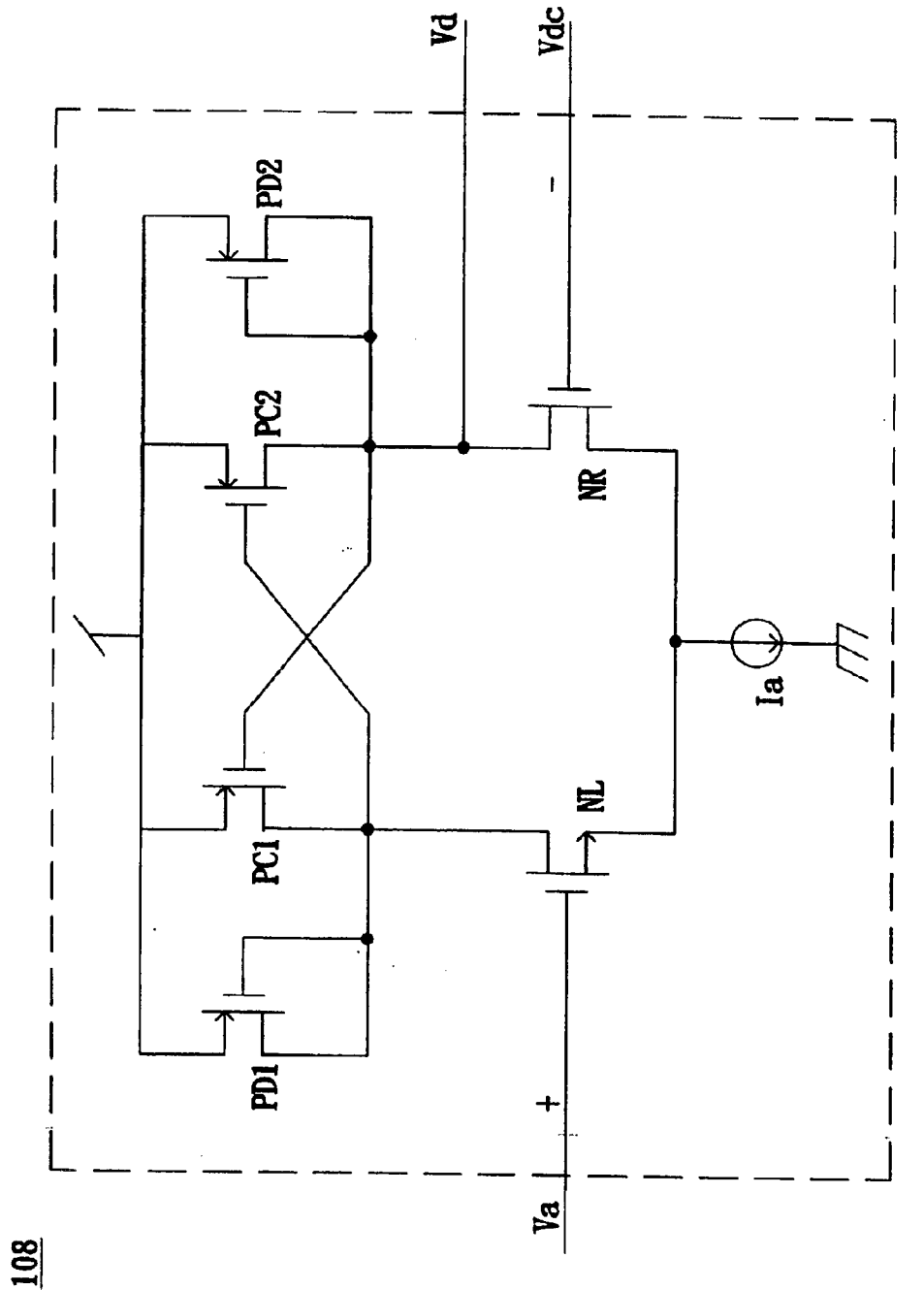
FIG. 4 a circuit diagram, schematically illustrating a circuit structure of the conventional hysteresis comparing device.
Figure 5:
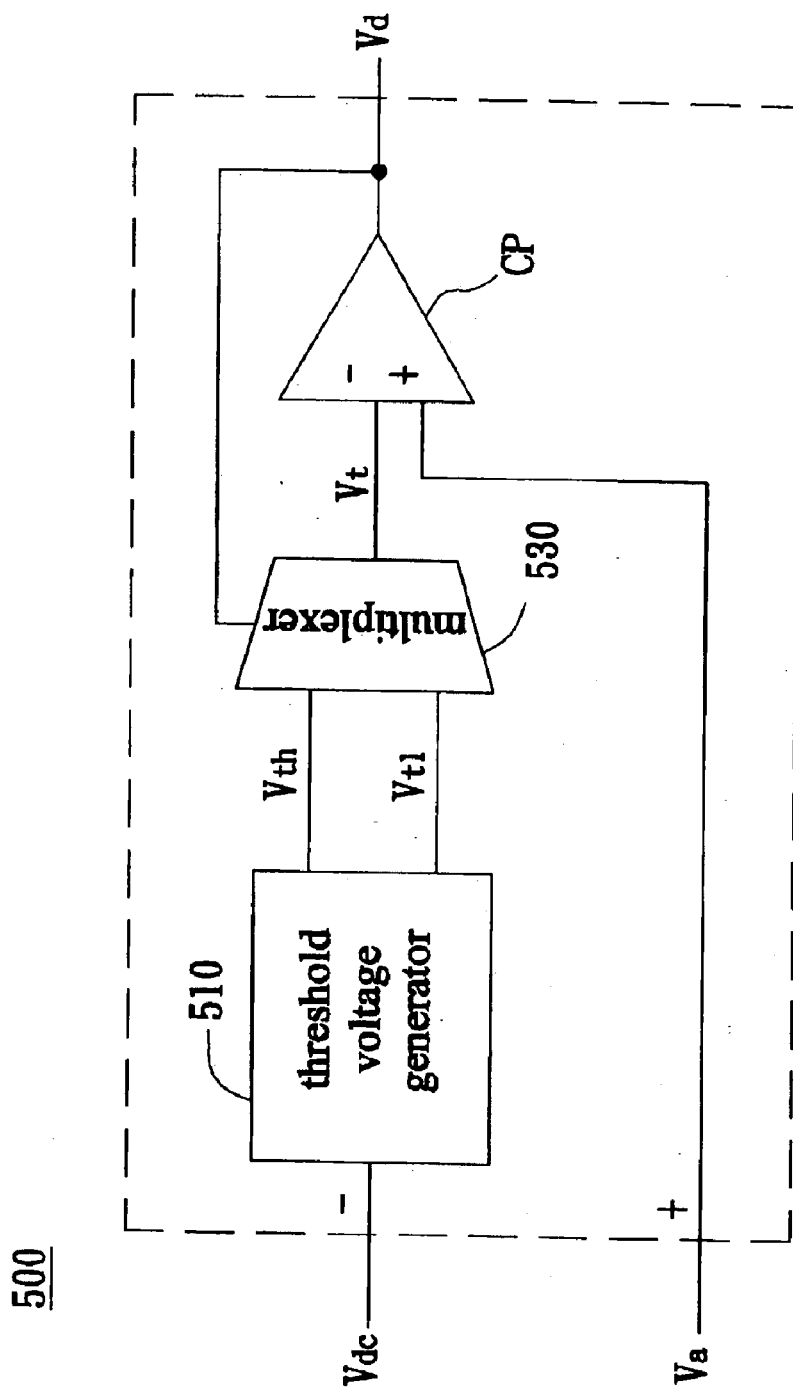
FIG. 5 is drawing of circuit diagram, schematically illustrating a circuit structure of the hysteresis comparing device, according one preferred embodiment of the present invention.

Referring to FIG. 5, it is a drawing of circuit diagram, schematically illustrating a circuit structure of the hysteresis comparing device 500, according one preferred embodiment of the present invention. The hysteresis comparing device 500 includes a threshold voltage generator 510, a multiplexer 530, and a next stage comparator (CP). The hysteresis comparing device 500 is used to receive a tracking signal Va and a low pass signal Vdc, and to output a digital signal Vd. The threshold voltage generator 510 is used to receive the low pass signal Vdc, and to output an upper threshold voltage Vth and a lower threshold voltage Vtl. The multiplexer 530 is coupled to the threshold voltage generator 510, and is used to receive the digital signal Vd, the upper threshold voltage Vth and the lower threshold voltage Vtl. Then, according to the feedback digital signal Vd, one of the upper threshold voltage Vth and the lower threshold voltage Vtl is chosen to be an output as the multiplexing signal Vt. When the digital signal is at the high voltage level, the multiplexing signal Vt then is the lower threshold voltage Vtl. In this situation, the tracking signal Va is necessary to be less than the lower threshold voltage Vtl, so as to be able to transform the output of the hysteresis comparing device 500 into a low voltage level. When the digital signal is at the low voltage level, the multiplexing signal Vt then is the upper threshold voltage Vth. In this situation, the tracking signal Va is necessary to be greater than the upper threshold voltage Vth, so as to be able to transform the output of the hysteresis comparing device 500 into a high voltage level. The next stage comparator CP is coupled to the multiplexer 530. A positive input terminal of the comparator receives the tracking signal Va, and the negative terminal of the comparator receives the multiplexing signal Vt. According to the tracking signal Va and the multiplexing signal Vt, the comparator outputs the digital signal Vd.

Figure 6:
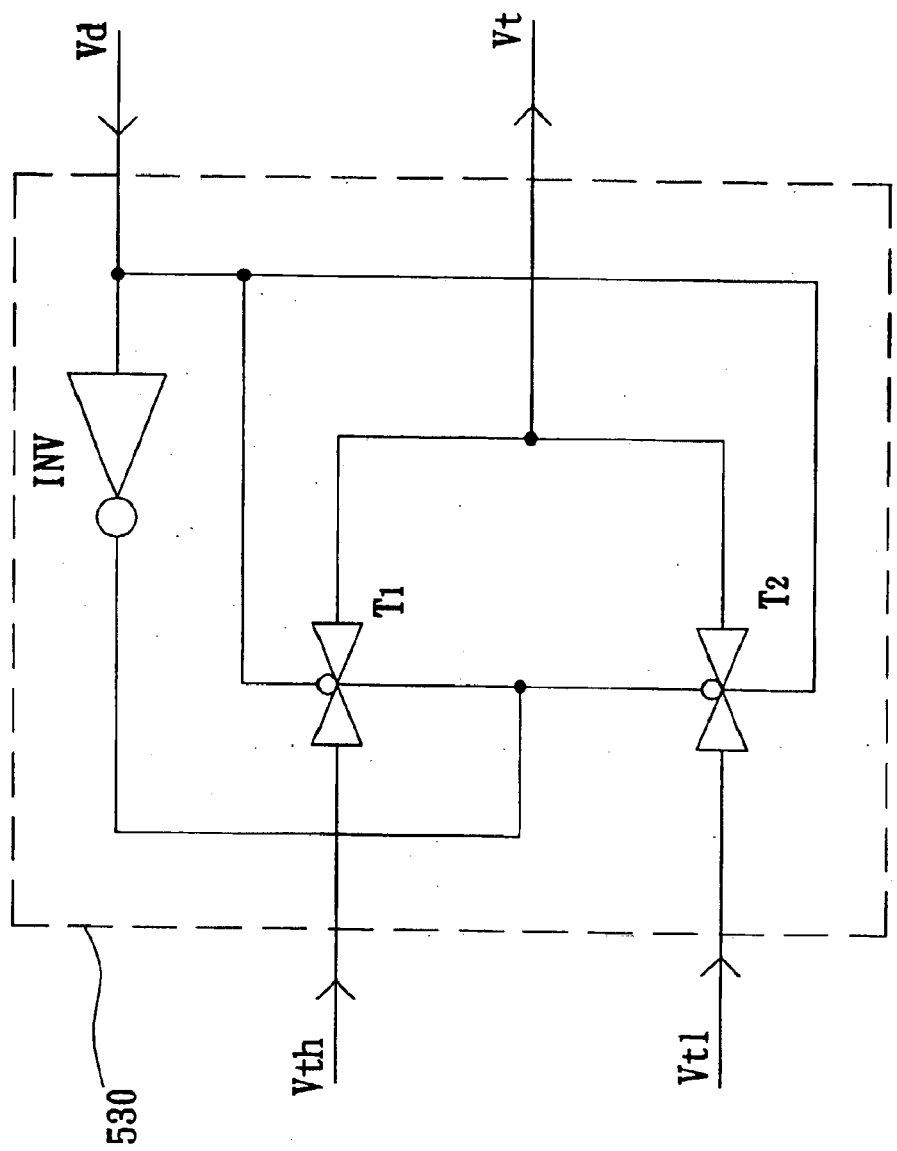
FIG. 6 is a circuit diagram, schematically illustrating a circuit structure of the multiplexer in FIG. 5, according to the preferred embodiment of the present invention.

Referring to FIG. 6, it is a drawing of circuit diagram, schematically illustrating a circuit structure of the multiplexer 530 in FIG. 5, according to the preferred embodiment of the present invention. The multiplexer 530 includes the transmission gates T1 and T2, and an inverter INV. The inverter INV is coupled to the output terminal of the next stage comparator CP, so as to receive the digital signal Vd to output an inverted digital signal Vd. Each one of the transmission gates T1 and T2 separately has a first transmission terminal, a second transmission terminal, a first control terminal, and a second control terminal. With respect to the transmission gate T1, the first transmission terminal is used to receive the upper threshold voltage Vth, and the second transmission terminal is coupled to the output terminal of the multiplexer 530. The first control terminal is used to receive the digital signal Vd. The second control terminal is coupled to the inverter INV and used to receive the inverted signal of the digital signal Vd. If the digital signal Vd is at the low voltage level, then the first transmission terminal and the second transmission terminal of the transmission gate T1 are both conducted, and this causes the multiplexer 530 to output the upper threshold voltage Vth. With respect to the transmission gate T2, the first transmission terminal is used to receive the lower threshold voltage Vtl, and the second transmission terminal is coupled to the output terminal of the multiplexer 530. The first control terminal is coupled to the put terminal of the multiplexer 530. The first control terminal is coupled to the inverter INV and used to receive the inverted signal of the digital signal Vd; and the second control terminal is coupled to an output terminal of the next stage comparator CP and used to receive the digital signal. If the digital signal Vd is at the high voltage level, then the first transmission terminal and the second transmission terminal of the transmission gate T1 are both conducted, and this causes the multiplexer 530 to output the lower threshold voltage Vtl.

Figure 7:
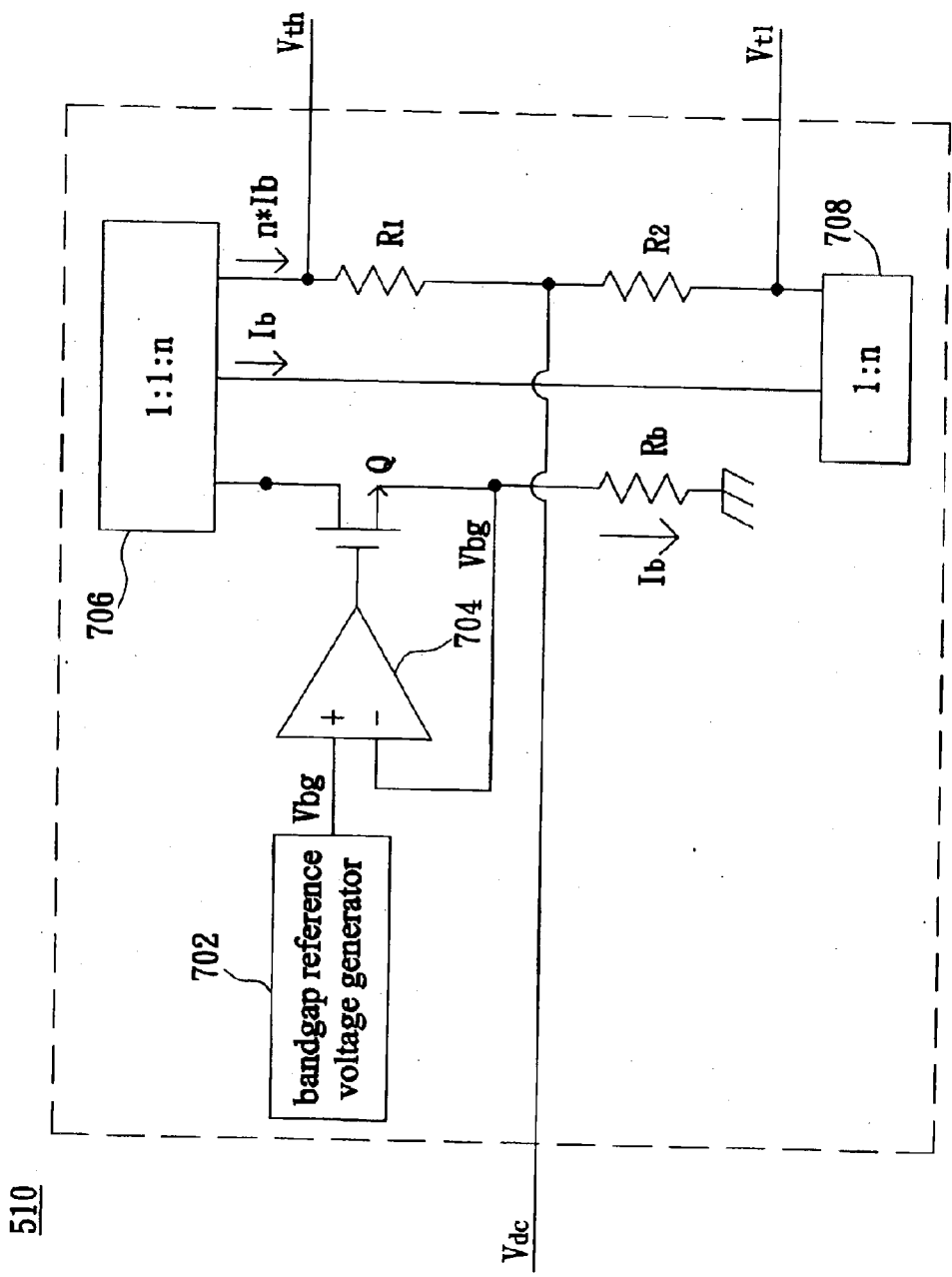
FIG. 7 is a circuit diagram, schematically illustrating a circuit structure of the threshold voltage generator in FIG. 5, according to the preferred embodiment of the present invention.

Referring to FIG. 7, it is a circuit diagram, schematically illustrating a circuit structure of the threshold voltage generator 510 in FIG. 5, according to the preferred embodiment of the present invention. The threshold voltage generator 510 includes a bandgap reference voltage generator 702, a transconductance amplifier 704, an NMOS transistor Q, a reference resistor Rb, a first current mirror 706, a second current mirror 708, a first resistor R1, and a second resistor R2. The bandgap reference voltage generator 702 is used to produce the bandgap reference voltage Vbg. A positive input terminal of the transconductance amplifier 704 is coupled to the bandgap reference voltage generator 702, in which the positive input terminal is used to receive the bandgap reference voltage Vbg. The gate electrode of the NMOS transistor Q is coupled to an output terminal of the transconductance amplifier 704. The source region of the transistor is coupled to the negative input terminal of the transconductance amplifier 704. One terminal of the reference resistor Rb is coupled to the source region of the transistor Q, and the other terminal is coupled to a ground voltage. Therefore, the current flowing through the reference resistor Rb has a quantity of Vbg/Rb. The first current mirror 706 is a current mirror having the feature of 1:1:n. That is, the first terminal of the first current mirror 706 receives the referencing current Ib and the second terminal generates the mirror current I1, and the third terminal generates the mirror current I2, in which I1=Ib, I2=n×Ib. The second current mirror 708 is a current mirror having the feature of 1:n, that is, the first terminal of the first current mirror 708 receives the mirror current I1, the second terminal generates the mirror current I2. The parameter n can be determined by the user. The first resistor R1 and the second resistor R2 are coupled in cascade, and both the resistors have the same quantity of resistance R. The mirror current I2 flows through both the resistor R1 and R2. One terminal of the first resistor R1 and the third terminal of the first current mirror 706 are coupled together, so as to receive the mirror current I2, in which the voltage quantity at this terminal is also the quantity of the upper threshold voltage Vth. The other terminal of the first resistor R1 is coupled to the second resistor R2, in which this terminal with its voltage is used to receive a low pass voltage Vdc. The second resistor R2 has one terminal coupled to the first resistor, and the other terminal is coupled to the second terminal of the second current mirror 708, in which this terminal has a voltage that is the lower threshold voltage Vtl. The voltage drop Vr1 of the first resistor R1 is a quantity of I2×R1=n×(Vgb/Rb)×R. If the resistor is affected by the environment condition, such as temperature, the resistance would increase or decrease by K percent. Since the first resistor R1 and the reference resistor Rb are made in the same material, then the first resistor R1 has a voltage drop of:

$$Vr1 = n \times \frac{Vbg}{Rb(1 \pm k\%)} \times R(1 \pm k\%) = n \times \frac{Vbg}{Rb} \times R.$$

According to the above equation, the voltage drop Vr1 of the resistor R1 is not affected by the environment conditions. The upper threshold voltage is Vth=Vr1+Vdc. Therefore, the upper threshold voltage Vth can remain in a stable level without being affected by the variation of environment. With the same reasons, the lower threshold voltage Vtl can also remain in a stable level. Thus, $Vth=Vdc+I2\times R$; and $Vtl=Vdc-I2\times R$, in which I2=n×(Vbg/Rb). The upper threshold voltage Vth and the lower threshold voltage Vtl are symmetric to the low pass voltage Vdc. The hysteresis width is $Vth-Vtl=2\times R\times(n\times Vbg/Rb)$.

According to the relation, it can be noted that the hysteresis width is constant, and not affected by the variation of the environments.

The present invention can provide the stable levels of the upper threshold voltage and the lower threshold voltage. As a result, the the hysteresis width can remain constant, and not affected by the variation of the environment conditions, so that the hysteresis comparing device can judge the received signals with higher precision.

In summary to the above descriptions, the hysteresis comparing device with constant hysteresis width disclosed in the foregoing embodiment of the present invention can suppress the affection from the glitch. In the present invention, under the affection of the environment, constant hysteresis width can still be provided, so that the hysteresis comparing device can judge the received signals with higher precision.

The invention has been described using exemplary preferred embodiments. However, it is to be understood that the scope of the invention is not limited to the disclosed embodi-

What is claimed is:

1. A hysteresis comparing device with constant hysteresis width, for receiving a first signal and a second signal and outputting a digital signal, the hysteresis comparing device comprising:
- a threshold voltage generator used to receive the first signal and output an upper threshold voltage and a lower threshold voltage, the threshold voltage generator comprising:
  - a bandgap reference voltage generator, used to produce a bandgap reference voltage;
  - a reference resistor for generating a reference current according to the bandgap reference voltage;
  - a current mirror for generating a second mirror current according to the reference current;
  - a first resistor and a second resistor connecting in series for receiving the first signal and the second mirror current, and outputting the upper threshold voltage and the lower threshold voltage;
- a multiplexer, coupled to the threshold voltage generator, and used to receive the upper threshold voltage and the lower threshold voltage, wherein the multiplexer also outputs a multiplexing signal according to the digital signal, and the multiplexing signal is from one of the upper threshold voltage and the lower threshold voltage; and
- a next stage comparator, wherein one terminal of the next stage comparator is used to receive the multiplexing signal, and another one terminal is used to receive the second signal, and the next stage comparator outputs the digital signal,
- wherein the first signal is obtained by low-pass filtering the second signal.

2. The hysteresis comparing device according to claim 1, wherein when the digital signal is in high level, then the multiplexing signal is set to be the lower threshold voltage, and when the digital signal is in low level, then the multiplexing signal is set to be the upper threshold voltage.

3. The hysteresis comparing device according to claim 1, wherein the first signal is a direct current (DC) signal.

4. The hysteresis comparing device according to claim 1, wherein the multiplexer comprises:
- an inverter, wherein the inverter is coupled to an output terminal of the next stage comparator and is used to receive the digital signal, wherein the digital signal is inverted and is outputted after inversion;
- a first transmission gate, including a first transmission terminal, a second transmission terminal, a first control terminal, and a second control terminal, wherein the first transmission terminal of the first transmission gate is used to receive the upper threshold voltage, and the second transmission terminal of the first transmission gate is coupled to an output terminal of the multiplexer, the first control terminal of the first transmission gate is coupled to the output terminal of the next stage comparator and used to receive the digital signal, the second control terminal of the first transmission gate is coupled to the inverter and used to receive an inverted signal of the digital signal, and if the digital signal is at a low voltage level, then the first transmission terminal and the second transmission terminal of the first transmission gate are both conducted, whereby the multiplexing signal outputted by the multiplexer is set to be the upper threshold voltage; and
- a second transmission gate, including a first transmission terminal, a second transmission terminal, a first control terminal, and a second control terminal, wherein the first transmission terminal of the second transmission gate is used to receive the lower threshold voltage, and the second transmission terminal of the second transmission gate is coupled to the output terminal of the multiplexer, the first control terminal of the second transmission gate is coupled to the inverter, the second control terminal of the second transmission gate is coupled to the next stage comparator and is used to receive the digital signal, and if the digital signal is at the high voltage level, then the first transmission terminal and the second transmission terminal of the second transmission gate are both conducted, whereby the multiplexing signal outputted by the multiplexer is set to be the lower threshold voltage.

5. The hysteresis comparing device according to claim 1, wherein the current mirror of the threshold voltage generator comprises:
- a first current mirror, wherein a first terminal is used to receive the reference current, a second terminal of the first current mirror is to output a first mirror current according to the reference current, and a third terminal of the first current mirror is to output the second mirror current according to the reference current; and
- a second current mirror, wherein a first terminal of the second current mirror and the second terminal of the first current mirror are connected and is used to receive the first mirror current, a second terminal of the second current mirror is to output a second mirror current according to the first mirror current.

6. The hysteresis comparing device according claim 5, wherein, the first resistor and the second resistor are connected between the third terminal of the first current mirror and the second terminal of the second current mirror;
- wherein the first signal is input to a second terminal of the first resistor, the second terminal of the first resistor is connected to a first terminal of the second resistor, a second terminal of the second resistor is connected to the second terminal of the second current mirror, and a first terminal of the first resistor is connected to the third terminal of the first current mirror;
- wherein the voltage of the first terminal of the first resistor is the upper threshold voltage, and the voltage of the second terminal of the second resistor is the lower threshold voltage.

7. The hysteresis comparing device according to claim 5, wherein the threshold voltage generator further comprises:
- a transconductance amplifier, coupled to the bandgap reference voltage generator, in which a positive input terminal of the transconductance amplifier is used to receive the bandgap reference voltage;
- a transistor, wherein a gate electrode of the transistor is coupled to an output terminal of the transconductance amplifier, a source electrode of the transistor is coupled to a negative input terminal of the transconductance amplifier and to the reference resistor, a drain electrode of the transistor is coupled to the first terminal of the first current mirror.

8. The hysteresis comparing device according to claim 5, wherein the first current mirror is a wide swing cascade current mirror with feature of 1:1:n, wherein the first mirror current is equal to the reference current, and the second mirror current is equal to the n times of the reference current, wherein n is a positive integer.

9. The hysteresis comparing device according to claim 5, wherein the second current mirror is a wide swing cascade current mirror with feature of 1:n, wherein n is a positive integer.

10. The hysteresis comparing device according to claim 5, wherein a resistance of the first resistor is equal to a resistance of the second resistor, so that the upper threshold voltage and the lower threshold voltage are symmetric to the first signal.

11. The hysteresis comparing device according to claim 5, wherein the first resistor, the second resistor, and the reference resistor are made of the same material.

12. A hysteresis comparing method with a constant hysteresis width, for receiving a first signal and a second signal and outputting a digital signal, the hysteresis comparing method comprising:

generating an upper threshold voltage and a lower threshold voltage according to the first signal;

outputting a multiplexing signal according to the digital signal, wherein the multiplexing signal is from one of the upper threshold voltage and the lower threshold voltage; and generating the digital signal by comparing the multiplexing signal and the second signal;

wherein the step of generating the upper threshold voltage and the lower threshold voltage comprises:
generating a bandgap reference voltage;
generating a reference current according to the bandgap reference voltage by a reference resistor;
generating a second mirror current according to the reference current by a current mirror; and
generating the upper threshold voltage and the lower threshold voltage according to the second mirror current and the first signal by a first resistor and a second resistor, wherein the first signal is obtained by low-pass filtering the second signal.

13. The hysteresis comparing method according to claim 12, wherein when the digital signal is in high level, then the multiplexing signal is set to be the lower threshold voltage, and when the digital signal is in low level, then the multiplexing signal is set to be the upper threshold voltage.

14. The hysteresis comparing method according to claim 12, wherein the first signal is a direct current (DC) signal.

15. The hysteresis comparing method according to claim 12, wherein the step of generating the second mirror current comprises:

generating a first mirror current and the second mirror current according to the reference current by a first current mirror; and generating the second mirror current according to the first mirror current by a second current mirror.

16. The hysteresis comparing method according to claim 15, wherein the first current mirror is a wide swing cascade current mirror with feature of 1:1:n, wherein the first mirror current is equal to the reference current, and the second mirror current is equal to the n times of the reference current, wherein n is a positive integer.

17. The hysteresis comparing method according to claim 15, wherein the second current mirror is a wide swing cascade current mirror with feature of 1:n, wherein n is a positive integer.

18. The hysteresis comparing method according to claim 12, wherein a resistance of the first resistor is equal to a resistance of the second resistor, so that the upper threshold voltage and the lower threshold voltage are symmetric to the first signal.

19. The hysteresis comparing method according to claim 12, wherein the first resistor, the second resistor, and the reference resistor are made of the same material.

* * * * *